(12) United States Patent
Baselmans et al.

(10) Patent No.: US 7,161,654 B2
(45) Date of Patent: Jan. 9, 2007

(54) LITHOGRAPHIC APPARATUS AND DEVICE MANUFACTURING METHOD

(75) Inventors: Johannes Jacobus Matheus Baselmans, Oirschot (NL); Sjoerd Nicolaas Lambertus Donders, 's-Hertogenbosch (NL); Christiaan Alexander Hoogendam, Veldhoven (NL); Jeroen Johannes Sophia Maria Mertens, Duizel (NL); Johannes Catharinus Hubertus Mulkens, Waalre (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/001,082

(22) Filed: Dec. 2, 2004

(65) Prior Publication Data

US 2006/0119807 A1 Jun. 8, 2006

(51) Int. Cl.
*G03B 27/52* (2006.01)
(52) U.S. Cl. .......................................... 355/30
(58) Field of Classification Search ............... 355/30
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,560,032 B1 | 5/2003 | Hatano | 359/656 |
| 6,600,547 B1 | 7/2003 | Watson et al. | |
| 6,603,130 B1 | 8/2003 | Bisschops et al. | 250/492.1 |
| 6,633,365 B1 | 10/2003 | Suenaga | 355/53 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |

(Continued)

FOREIGN PATENT DOCUMENTS

DE          206 607          2/1984

(Continued)

OTHER PUBLICATIONS

Translation (English) of Japanese Patent Application No. 2002-357641.*

(Continued)

*Primary Examiner*—W. B. Perkey
*Assistant Examiner*—Vivian Nelson
(74) *Attorney, Agent, or Firm*—Pillsbury Winthrop Shaw Pittman LLP

(57) ABSTRACT

An immersion lithographic apparatus is disclosed which includes a liquid supply system having an inlet configured to supply a liquid to a space between a projection system of the lithographic apparatus and a substrate and an outlet configured to remove at least part of the liquid, the liquid supply system configured to rotate the inlet, the outlet, or both, about an axis substantially perpendicular to an exposure plane of the substrate.

33 Claims, 6 Drawing Sheets

U.S. PATENT DOCUMENTS

| | | | |
|---|---|---|---|
| 2004/0075895 A1 | 4/2004 | Lin | 359/380 |
| 2004/0109237 A1 | 6/2004 | Epple et al. | |
| 2004/0114117 A1 | 6/2004 | Bleeker | |
| 2004/0119954 A1 | 6/2004 | Kawashima et al. | 355/30 |
| 2004/0125351 A1 | 7/2004 | Krautschik et al. | 355/53 |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2005/0225738 A1* | 10/2005 | Shirai | 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| EP | 1477856 | 11/2004 |
| EP | 1494079 | 1/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004320017 | 11/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004053959 A1 * | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W., Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 βm Fine Patterns Using Optical Projection Lithography with an Oil Immersion Lens", Jpn. J. Appl. Phys. vol. 31 (1992), pp. 4174-4177.

G. Owen et al., "1/8 βm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\kappa$NA scaling equations for resolution, depth of focus, and immersion lithography, *J. Microlith., Microfab., Microsyst.* 1(1):7-12 (2002).

Search Report for European Application No. 05257182.5-2222, dated Mar. 10, 2006.

U.S. Appl. No. 10/944,415, filed Sep. 20, 2004, Hoogendam et al.
U.S. Appl. No. 10/698,012, filed Oct. 31, 2003, Flagello et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/719,683, filed Nov. 24, 2003, Streefkerk et al.
U.S. Appl. No. 10/367,910, filed Feb. 19, 2003, Suwa et al.

* cited by examiner

Fig. 2
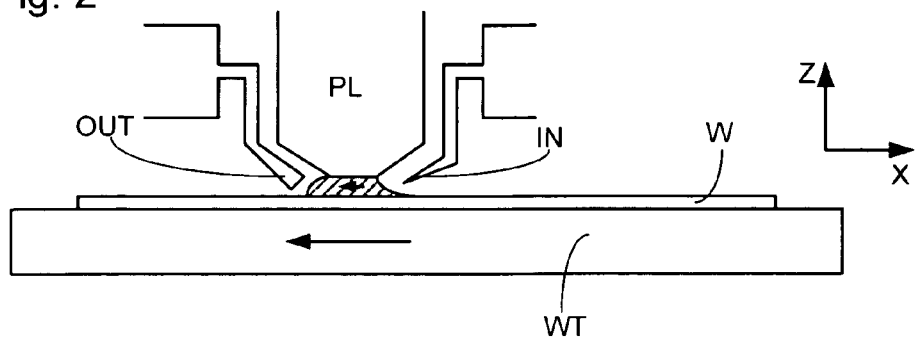
Fig. 3
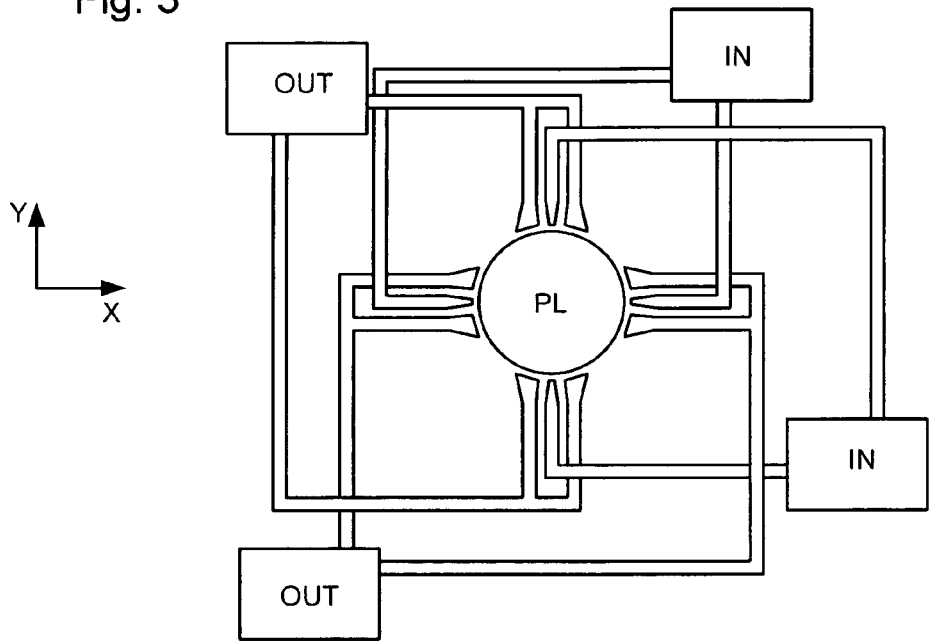
Fig. 4
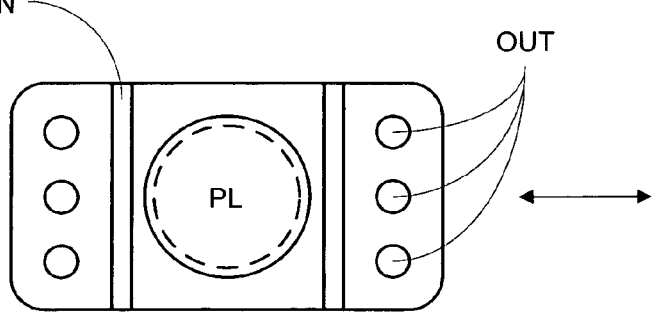
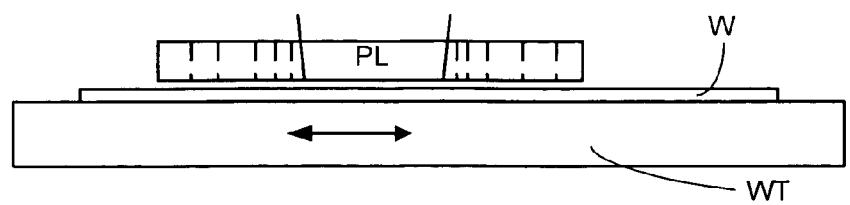

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

It would be advantageous, for example, to provide a lithographic apparatus having a liquid supply system wherein a substrate may be moved in different directions without having to switch a flow direction of the liquid between the projection system of the lithographic apparatus and a substrate.

According to an aspect of the invention, there is provided a lithographic apparatus, comprising:

an illumination system configured to condition a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate; and a liquid supply system comprising an inlet configured to supply a liquid to a space between the projection system and the substrate and an outlet configured to remove at least part of the liquid, the liquid supply system configured to rotate the inlet, the outlet, or both, about an axis substantially perpendicular to an exposure plane of the substrate.

According to an aspect of the invention, there is provided a lithographic apparatus, comprising:

an illumination system configured to condition a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate; and a liquid supply system comprising an inlet configured to supply a liquid to a space between the projection system and the substrate and an outlet configured to remove at least part of the liquid, the liquid supply system configured to rotate the inlet and outlet in tandem about an axis substantially parallel to an optical axis of the projection system in accordance with a change in movement of the substrate.

According to a further aspect of the invention, there is provided a device manufacturing method, comprising:

supplying a liquid to a space between a projection system of a lithographic apparatus and a substrate;

rotating an inlet configured to supply the liquid to the space, an outlet configured to remove the liquid, or both, about an axis substantially perpendicular to an exposure plane of the substrate; and projecting a patterned beam of radiation, using the projection system, through the liquid onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
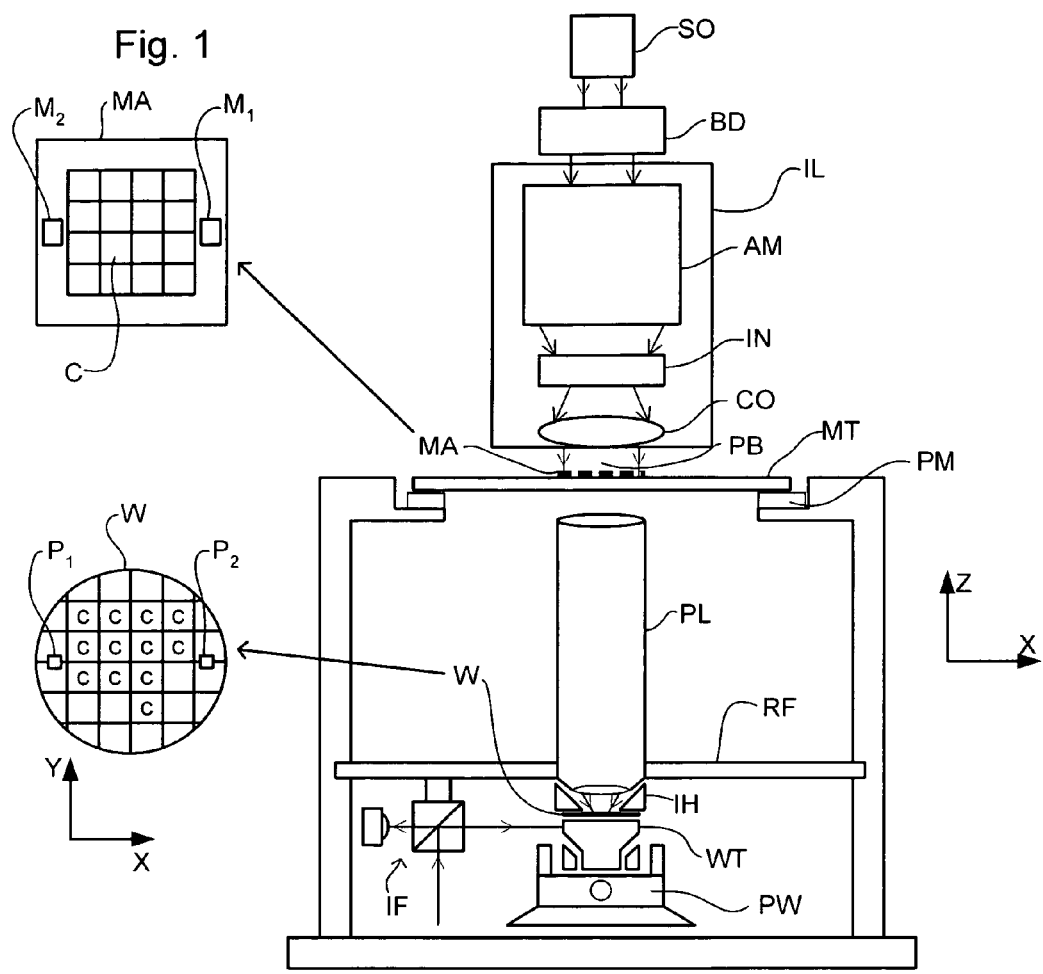
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. A liquid confinement structure IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a liquid confinement structure, such as plate with a hole in its center, through which the projection beam is projected. Liquid is supplied by one groove inlet IN on one side of the projection system and removed by a plurality of discrete outlets OUT on the other side of the projection system, causing a flow of a thin film of liquid between the projection system and the substrate. The choice of which combination of inlet IN and outlets OUT to use can depend on the direction of movement of the substrate (the other combination of inlet IN and outlets OUT being inactive).

Figure 5:
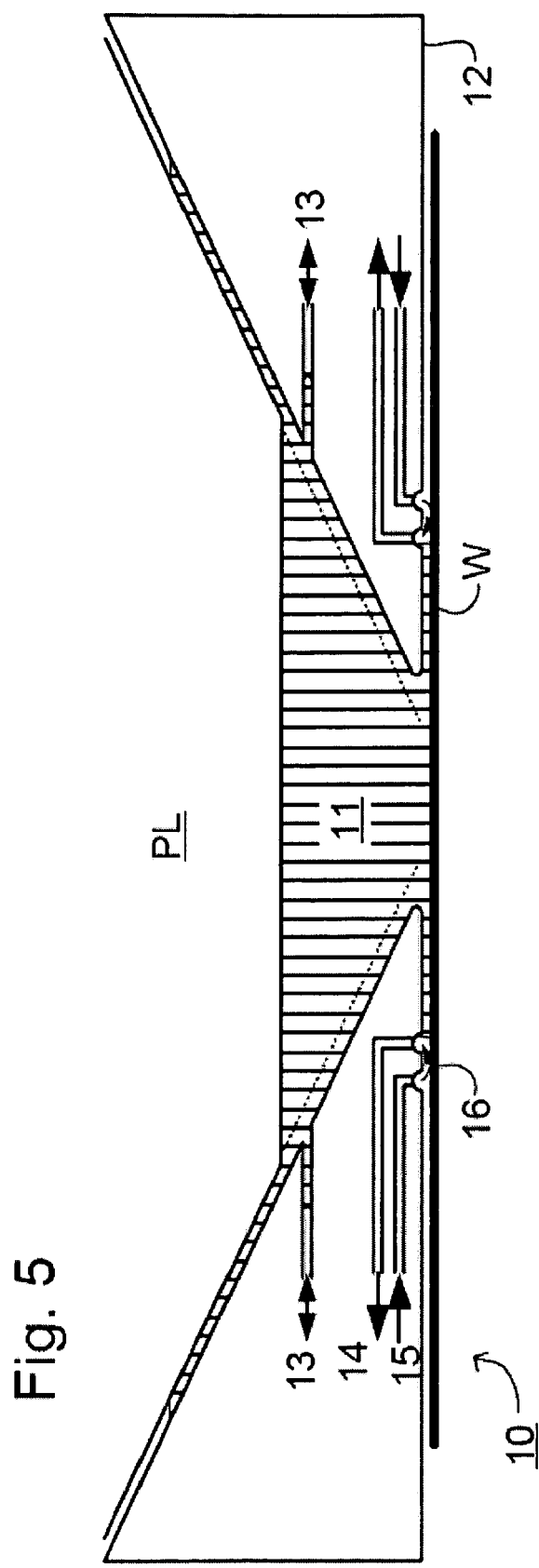
FIG. 5 depicts another liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is schematically illustrated in FIG. 5. The liquid confinement structure is substantially stationary relative to the projection system in the X-Y plane though there may be some relative movement in the Z direction (in the direction of the optical axis). A seal is formed between the liquid confinement structure and the surface of the substrate.

Referring to FIG. 5, reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure. The liquid confinement structure extends a little above the final element of the projection system and the liquid level rises above the final element so that a buffer of liquid is provided. The liquid confinement structure has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the inlet 15, vacuum level on the first outlet 14 and geometry of the gap are arranged so that there is a high-velocity gas flow inwards that confines the liquid. Such a system is disclosed in U.S. patent application Ser. No. 10/705,783, hereby incorporated in its entirety by reference.

In the liquid confinement structure of FIG. 5, liquid may supplied to and/or removed from the space between the projection system and the substrate/substrate table by port 13. In an embodiment, port 13 comprises a pair of inlets 13 (for example, on opposite sides of an exposure field) which supply liquid to the space. The liquid supplied by the inlet(s) 13 may be removed by outlet 14 which surrounds a periphery of the exposure field (as used herein, exposure field includes not only an area through which the projection beam passes but additionally or alternatively may include an area through which measurement, by for a measurement radiation beam, may be taken). Due to the outlet 14, liquid is confined to the space and within the exposure field irrespective of the direction of movement of the substrate/substrate table. A liquid flow may be established and/or maintained in the space through appropriate configuration of inlet(s) 13 and outlet 14. However, where only seal 16 is used, liquid supplied by inlet(s) to the space and within the exposure field may only just be maintained therein without a liquid flow in the space.

In an embodiment, port 13 comprises an inlet and an outlet (for example, on opposite sides of an exposure field). The seal 16, which surrounds an exposure field, confines the liquid to the space and within the exposure field without a need for a liquid outlet. Where a flow of liquid through the space is desired, the inlet/outlet 13 may be appropriately configured to establish and/or maintain the flow.

In an embodiment, the port 13 extends around a periphery of an exposure field and thus provides a rotationally symmetric liquid inlet. Where port 13 only includes an inlet, outlet 14 may be provided around a periphery of an exposure field to contain liquid therein during movement of the substrate/substrate table in any direction. Additionally or alternatively, seal 16 provided around a periphery of an exposure field may contain liquid in the exposure field during movement of the substrate/substrate table in any direction. And, where port 13 further includes an outlet and a liquid flow is established between the inlet and outlet of port 13, seal 16 provided around a periphery of an exposure field may contain liquid in the exposure field during movement of the substrate/substrate table in any direction.

Thus, with the liquid supply system of FIG. 5, liquid is confined to the space between the projection system and the substrate/substrate table and within the exposure field without the need for turning off or on particular inlet(s) and/or outlet(s) or without depending on a direction of movement of the substrate/substrate table.

Figure 6:
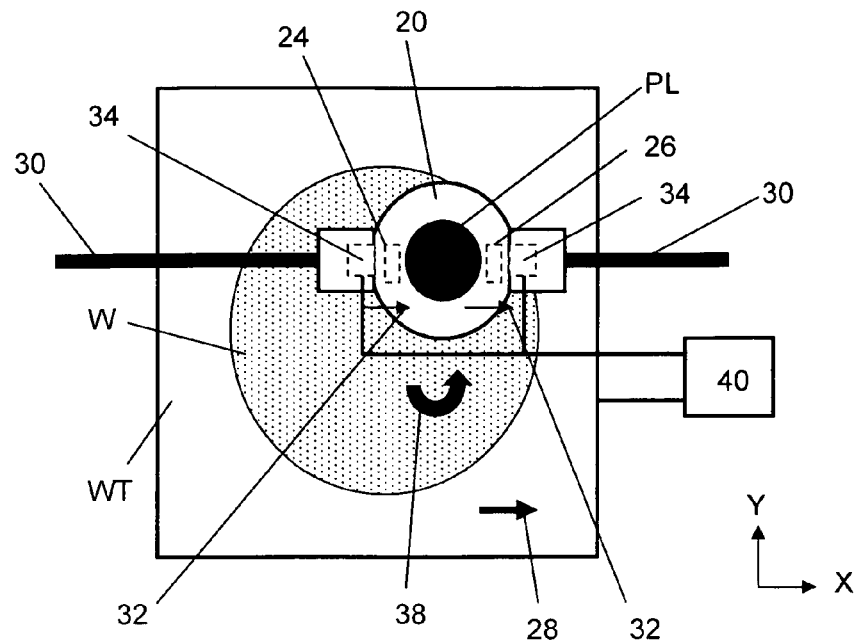
FIG. 6 depicts a top view of a liquid supply system according to an embodiment of the invention.
Figure 7:
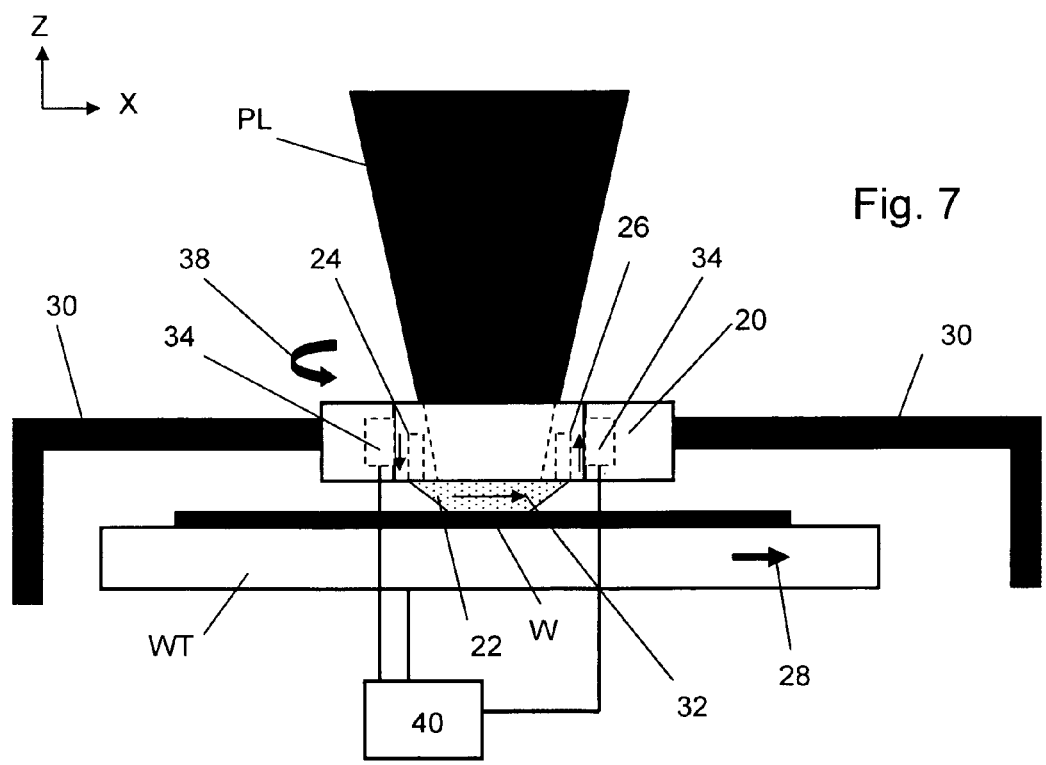
FIG. 7 depicts a side view of the liquid supply system of FIG. 6.

Referring to FIGS. 6 and 7, a top view and a side view, respectively, of a liquid supply system according to an embodiment of the invention are schematically depicted. The liquid supply system comprises a liquid confinement structure 20 configured to at least partially confine a liquid to a space 22 between the projection system and the substrate W and/or substrate table WT. The liquid confinement structure 20 comprises an inlet 24 configured to supply liquid to the space and an outlet 26 configured to remove the liquid. The substrate/substrate table moves relative to the liquid confinement structure (and the projection system) in an X-Y plane substantially parallel to a plane of the liquid confinement structure. In FIGS. 6 and 7, arrows 28 (e.g., in the X direction) depict one example of this movement, although as will be apparent the substrate/substrate table may move in other directions (including rotations)

The liquid confinement structure is connected to a base or the ground (not shown) via a frame 30. In an embodiment, the projection system is connected to a different frame (not shown) from the liquid confinement structure so that the projection system and the liquid confinement structure are mechanically isolated such that transmission of vibrations and forces between the projection system and the liquid confinement structure is minimized or reduced. The different frame for the projection system may also be connected to the base or ground or may connected to, but isolated from, the frame for the liquid confinement structure. The liquid confinement structure is substantially stationary in the X and Y directions and may move in the Z direction. In FIG. 6, a top portion of the projection system (seen, for example, in FIG. 7) is omitted so the liquid confinement structure can be clearly seen.

In an embodiment, like the liquid supply system in FIGS. 2, 3 and 4, the movement of the substrate W/substrate table WT facilitates confinement and distribution of the liquid in the space and within an exposure field. In particular, liquid is supplied by the inlet to the space at one side of the exposure field and movement of the substrate/substrate table facilitates distribution of the liquid in the exposure field and to the outlet on an opposite side of the exposure field. Thus, the projection system and the liquid confinement structure provide confinement for a top of the space, the substrate/substrate table provide confinement for a bottom of the space, and the inlet and outlet on opposite sides of an exposure field in combination with movement of the substrate/substrate table in a direction from the inlet to the outlet provide distribution and confinement laterally within the space. The combination of the movement of the substrate/substrate table and positioning of the inlet and outlet on opposite sides of the exposure field facilitates to establish and maintain a flow of a thin film of liquid in the space. The arrows 32 (e.g., extending in the X direction) depict an example of the flow of the liquid in the space although as will be apparent the flow of liquid may move in other directions (including rotations) depending on the positioning of the inlet and outlet and the movement of the substrate/substrate table.

In the supply systems of FIG. 2, 3 and 4, where there is a change in direction of movement of the substrate/substrate table, confinement and distribution of the liquid in the space and within an exposure field is facilitated by activating/deactivating one or more particular inlet and outlets on or outside a periphery of the exposure field. For example, in the case of FIGS. 2, 3 and 4, a first inlet IN on one side of the exposure field supplies liquid to the space and a first outlet OUT on another side of the exposure field when the substrate/substrate table moves in a first direction from the first inlet IN towards the second outlet OUT. Where the substrate/substrate table moves in a second direction 180° to the first direction, a second inlet IN and a second outlet OUT are activated and the first inlet IN and second outlet OUT are deactivated. The second inlet IN is positioned at a position opposite to the first inlet IN (adjacent the first outlet OUT) and the second outlet OUT is positioned at a position opposite to the first outlet OUT (adjacent the first inlet IN). Thus, in this configuration, the second direction of the substrate/substrate table is from the second inlet IN towards the second outlet OUT. In an embodiment, the first inlet IN may be switched into the second outlet OUT, for example, by switching from a liquid source to a low pressure source, and the first outlet OUT may be switched into the second inlet IN, for example, by switching from a low pressure source to a liquid supply. Inlets and outlets may also be provided for movements of the substrate/substrate table in other directions (see, for example, FIG. 3). Thus, the liquid supply systems of FIGS. 2, 3 and 4 employ a non-rotationally symmetric liquid inlet and outlet system leading to the switching of liquid inlet and outlet positions on or outside the periphery of the exposure field depending on substrate/ substrate table movement (e.g., in a scan direction) through activation/deactivation of one or more liquid inlets and outlets.

In an embodiment, switching of liquid inlet and outlet positions through activation/deactivation of one or more liquid inlets and outlets may be avoided where one or more inlets and/or outlets are rotated around an axis substantially perpendicular to an exposure plane of the substrate, e.g., the Z axis or an optical axis of the projection system. Referring to FIGS. 6 and 7, one or more motors 34 rotate the liquid confinement structure, comprising the inlet and outlet, relative to the frame and about the axis, thus moving both the inlet and outlet in tandem. The curved arrows 38 show how the liquid confinement structure rotates. A controller 40 controls the motor(s) based upon a direction of movement of the substrate/substrate table. In particular, the controller controls the motor(s) so that the liquid confinement structure is positioned so that a direction from the inlet to the outlet is substantially parallel and in the same direction as the movement of the substrate/substrate table. In this way, the inlet and outlet need not be activated/deactivated as the liquid confinement structure rotates with a change in the movement of the substrate/substrate table to keep the liquid confined in the space between the projection system and the substrate/substrate table and the flow of liquid in the space in the same direction as the movement of the substrate/substrate table. With appropriate rotation of the inlet and outlet, the movement of the substrate/substrate table may automatically transport the liquid from the inlet to the outlet in all directions of movement of the substrate/substrate table. The controller may operated in a feed-forward or feedback manner.

In an embodiment, the liquid supply system is configured to rotate the inlet, the outlet, or both, about an axis substantially perpendicular to an exposure plane of the substrate. While the liquid supply system may be able to provide all these rotating functions, in embodiments, the liquid supply system may provide rotation of only the inlet (without the ability to rotate the outlet) or rotation of only the outlet (without the ability to rotate the inlet) or rotation of both the inlet or outlet. In other words, a liquid supply system need not be able to provide all these rotation capabilities but rather may provide only one type of rotation capability.

Figures 8A, 8B:
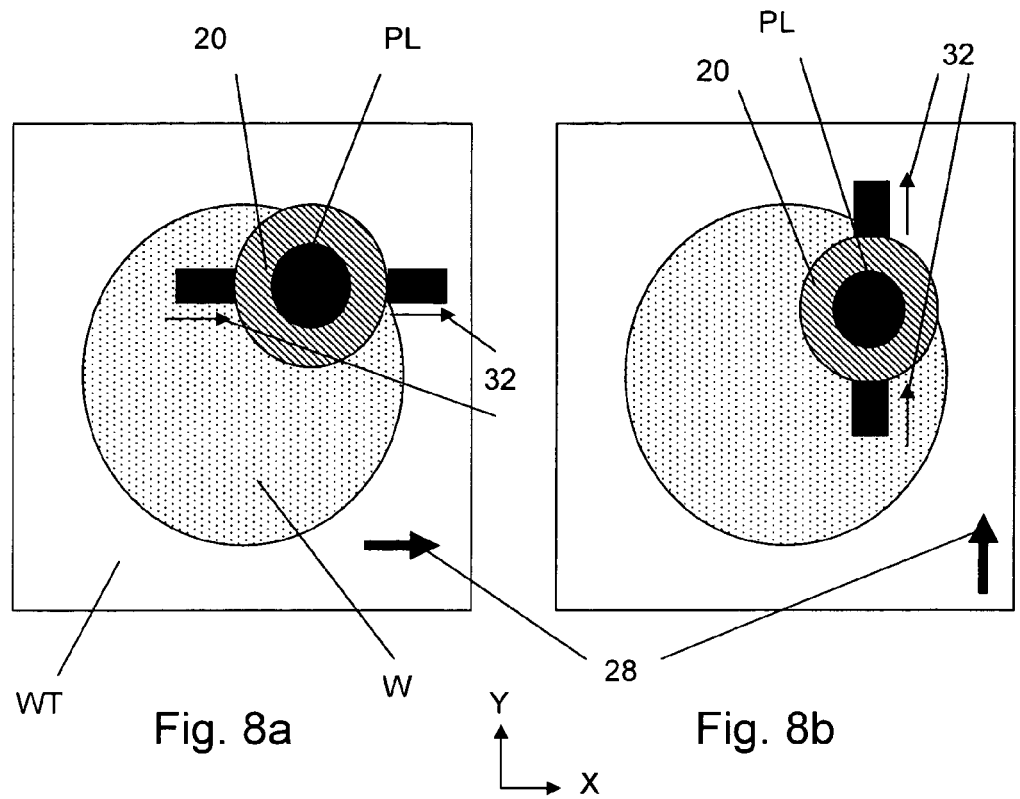
FIGS. 8a to 8c depict various rotations of a liquid confinement structure according to an embodiment of the invention.
Figure 8C:
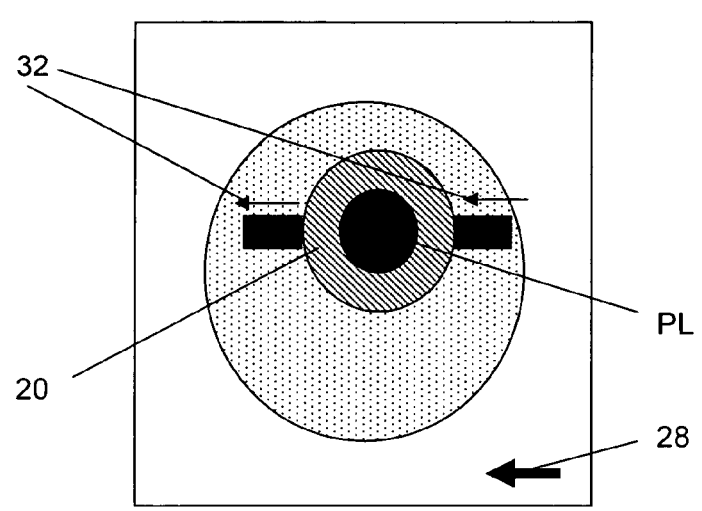

Referring to FIGS. 8a to 8c, the liquid confinement structure is shown schematically at different rotations to explain the operation of the liquid supply system according to an embodiment of the invention. In this example, however, the liquid confinement structure is connected to the projection system (or a frame supporting the projection system) without the use of a frame as depicted in FIGS. 4 and 5. In this case, one or more motors (not shown) move the liquid confinement structure relative to the projection system about an axis substantially parallel to the optical axis of the projection system. Transmission of vibrations and/or forces between the liquid confinement structure and the projection system may be reduced or avoided through the use of an isolator or a damping mechanism. The rotation of this exemplary liquid confinement structure is substantially similar to the rotation of the exemplary liquid confinement structure in FIGS. 4 and 5.

Referring to FIG. 8a, the liquid confinement structure is positioned so that a direction from the inlet to the outlet of the liquid confinement structure (represented by arrows) is substantially parallel to and in the same direction as the movement of the substrate/substrate table (represented by arrow). In FIG. 8a, the movement of the substrate/substrate table is in a scanning direction. When the movement of the substrate/substrate table changes to, for example, a stepping direction as shown in FIG. 8b, the liquid confinement structure is rotated about 90 degrees in the clockwise direction so that the direction from the inlet to the outlet of the liquid confinement structure (represented by arrows) is substantially parallel to and in the same direction as the movement of the substrate/substrate table (represented by arrow). When the movement of the substrate/substrate table changes again to, for example, a scanning direction again (although having an opposite sign to the scanning direction in FIG. 8a) as shown in FIG. 8c, the liquid confinement structure is rotated about 90 degrees further in the clockwise direction so that the direction from the inlet to the outlet of the liquid confinement structure (represented by arrows) is substantially parallel to and in the same direction as the movement of the substrate/substrate table (represented by arrow). If the movement of the substrate/substrate table changed again to, for example, a stepping direction such as shown in FIG. 8b, the liquid confinement structure need only be rotated about 90 degrees in the counterclockwise direction so that the direction from the inlet to the outlet of the liquid confinement structure (represented by arrows) is substantially parallel to and in the same direction as the movement of the substrate/substrate table (represented by arrow). Thus, while the one or more inlets and/or outlets may be rotated to any angle in an embodiment (e.g., 0 to 360 degrees), the one or more inlets and/or outlets may be rotated only within the range from 0 to 200 degrees.

In an embodiment, the one or more inlets and/or outlets may be rotated only to positions where the direction from the inlet to the outlet of the liquid confinement structure is substantially parallel to and in the same direction as the scanning movement of the substrate/substrate table. In this case, only a limited number of rotations may be needed.

In an embodiment, instead of the liquid confinement structure being rotated, an individual inlet and/or outlet or a group of inlets and/or outlets may rotated within the liquid confinement structure itself. For example, where an outlet is provided around a periphery of an exposure field, it may be advantageous simply to rotate one or more inlets around all or a part of the periphery of the exposure field.

While one or more motors were described above to rotate the liquid confinement structure or the one or more inlets and/or outlets, almost any movement mechanism may be used. The motor(s) may be one or more linear motors or one or more mechanical actuators. The frame and/or liquid confinement structure may comprise a track to guide the rotation of the one or more inlets and/or outlets or the liquid confinement structure. One or more appropriate bearings may be provided.

Rotation of one or more of the inlets and/or outlets has an advantage of avoiding activating/deactivating one or more inlets and/or outlets. Such activation/deactivation may have deleterious effects to the liquid quality. For example, valves in the liquid supply system may be contaminated and so introduce contamination in the liquid when liquid inlet and outlet positions are switched through activation/deactivation of one or more inlets and/or outlets. Changing the direction of or stopping the flow of liquid through particle filters and/or de-bubblers may cause introduction of contamination and/or bubbles when switching liquid inlet and outlet positions through activation/deactivation of one or more inlets and/or outlets. Further, where a liquid supply system has a single liquid inlet and a single liquid outlet or an inlet/outlet combination at each of two opposing positions (such as for example as shown in FIG. 4), rotation may help to avoid or reduce liquid leakage in certain substrate/substrate table movement directions, for example, in a direction perpendicular to the line between the single liquid inlet and the single liquid outlet or perpendicular to the line between the inlet/outlet combinations at opposing positions. Further, rotation may help to avoid or reduce deleterious vibrations in the lithographic apparatus caused by activation/deactivation of one or more inlets and/or outlets.

Figure 9:
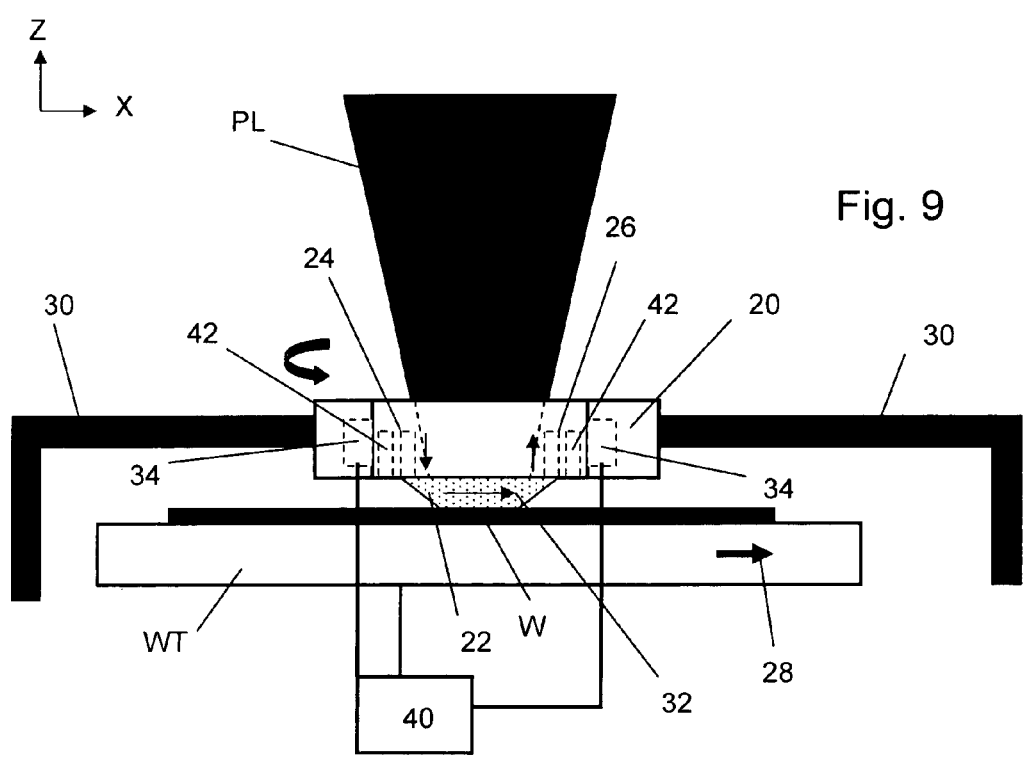
FIG. 9 depicts a side view of a liquid supply system according to another embodiment of the invention.

In an embodiment, the inlet, the outlet, or both may be rotated so as to maintain the flow of liquid in a direction substantially perpendicular to a direction of movement of the substrate. To maintain the liquid in the exposure field, a seal or outlet is provided around the periphery of the exposure field to contain or remove liquid as movement of the substrate perpendicular to the direction of the flow of the liquid in the exposure field may draw the liquid out of the exposure field (as distinct from a flow of liquid in the same direction as a direction of movement of the substrate in which case surface tension could keep the liquid substantially in the exposure field) and out to portions of the apparatus where liquid is undesirable. Referring to FIG. 9, the liquid supply system of this embodiment is substantially the same as shown in FIG. 7 except that an outlet 42 is provided around a periphery of the exposure field to remove liquid that may escape from the exposure field. Depending on the configuration of the liquid supply system, the flow of liquid and/or the movement of the substrate, the outlet 42 need not fully surround the exposure field.

In an embodiment, the inlet, the outlet, or both may rotated so as to maintain the flow of liquid, at different times or points, in a direction substantially perpendicular to a direction of movement of the substrate or in a direction substantially parallel to a direction of movement of the substrate.

In a twin or dual stage immersion lithography apparatus, two tables are provided for respectively supporting a substrate. Leveling measurements are carried out with a table at a first position, without immersion liquid, and exposure is carried out with a table at a second position, where immersion liquid is present. Alternatively, the apparatus has only one table and moves between separate leveling and exposure positions.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   an illumination system configured to condition a beam of radiation;
   a support structure configured to hold a patterning device, the patterning device configured to impart the beam with a pattern in its cross-section;
   a substrate table configured to hold a substrate;
   a projection system configured to project the patterned beam onto a target portion of the substrate; and
   a liquid supply system comprising an inlet configured to supply a liquid to a space between the projection system and the substrate and an outlet configured to remove at least part of the liquid, the liquid supply system configured to rotate the inlet, the outlet, or both, about an axis substantially perpendicular to an exposure plane of the substrate.

2. The apparatus according to claim 1, wherein the liquid supply system comprises a liquid confinement structure configured to at least partly confine the liquid in the space, the liquid confinement structure comprising the inlet and the outlet and configured to rotate about the axis.

3. The apparatus according to claim 2, wherein the inlet and outlet are respectively positioned on opposite sides of an exposure field through which the patterned beam is to be projected.

4. The apparatus according to claim 2, wherein the liquid confinement structure is supported on a frame connected to a base of the apparatus or ground and the liquid supply system comprises a motor configured to rotate the liquid confinement structure relative to the frame.

5. The apparatus according to claim 1, wherein, in use, a direction of flow of the liquid in the space substantially corresponds to a direction of movement of the substrate.

6. The apparatus according to claim 5, wherein, in use, the direction of the flow of the liquid in the space substantially corresponds to a direction of scanning movement of the substrate.

7. The apparatus according to claim 1, comprising a controller configured to maintain, through rotation of the inlet, the outlet, or both, a direction of flow of the liquid in the space to substantially correspond to the direction of movement of the substrate whenever the substrate is moved.

8. The apparatus according to claim 1, wherein the inlet, the outlet, or both, are configured to be rotated less than or equal to 360 degrees.

9. The apparatus according to claim 1, wherein the inlet, the outlet, or both, are configured to be rotated less than or equal to 200 degrees.

10. The apparatus according to claim 1, wherein the controller is configured to rotate the inlet, the outlet, or both only to positions where a direction from the inlet to the outlet is substantially parallel to and in the same direction as a scanning movement of the substrate.

11. The apparatus according to claim 1, comprising a motor configured to rotate the inlet, the outlet, or both, in a counterclockwise direction and a clockwise direction about the axis.

12. The apparatus according to claim 1, wherein the liquid supply system comprises a plurality of inlets, a plurality of outlets, or both and is configured to rotate the inlets, the outlets, or both.

13. The apparatus according to claim 1, wherein, in use, a direction of flow of the liquid in the space is substantially perpendicular to a direction of movement of the substrate.

14. The apparatus according to claim 1, wherein the liquid supply system is configured to rotate the inlet only about an axis substantially perpendicular to an exposure plane of the substrate.

15. The apparatus according to claim 1, wherein the liquid supply system is configured to rotate the outlet only about an axis substantially perpendicular to an exposure plane of the substrate.

16. The apparatus according to claim 1, wherein the liquid supply system is configured to rotate the inlet and outlet about an axis substantially perpendicular to an exposure plane of the substrate.

17. A lithographic apparatus, comprising:
an illumination system configured to condition a beam of radiation;
a support structure configured to hold a patterning device, the patterning device configured to impart the beam with a pattern in its cross-section;
a substrate table configured to hold a substrate;
a projection system configured to project the patterned beam onto a target portion of the substrate; and
a liquid supply system comprising an inlet configured to supply a liquid to a space between the projection system and the substrate and an outlet configured to remove at least part of the liquid, the liquid supply system configured to rotate the inlet and outlet in tandem about an axis substantially parallel to an optical axis of the projection system in accordance with a change in movement of the substrate.

18. The apparatus according to claim 17, wherein the inlet and the outlet are configured to be rotated less than or equal to 200 degrees.

19. The apparatus according to claim 17, wherein, in use, a direction of flow of the liquid in the space is substantially perpendicular to a direction of movement of the substrate.

20. A device manufacturing method, comprising:
supplying a liquid to a space between a projection system of a lithographic apparatus and a substrate;
rotating an inlet configured to supply the liquid to the space, an outlet configured to remove at least part of the liquid, or both, about an axis substantially perpendicular to an exposure plane of the substrate; and
projecting a patterned beam of radiation, using the projection system, through the liquid onto a target portion of the substrate.

21. The method according to claim 20, comprising using a liquid confinement structure to at least partly confine the liquid in the space, the liquid confinement structure comprising the inlet and the outlet and configured to rotate about the axis.

22. The method according to claim 21, wherein the inlet and outlet are respectively positioned on opposite sides of an exposure field through which the patterned beam is projected.

23. The method according to claim 21, comprising:
supporting the liquid confinement structure on a frame connected to a base of the lithographic apparatus or ground; and
rotating the liquid confinement structure relative to the frame.

24. The method according to claim 20, wherein a direction of flow of the liquid in the space substantially corresponds to a direction of movement of the substrate.

25. The method according to claim 24, wherein the direction of the flow of the liquid in the space substantially corresponds to a direction of scanning movement of the substrate.

26. The method according to claim 20, comprising maintaining, through rotation of the inlet, the outlet, or both, a direction of flow of the liquid in the space to substantially correspond to the direction of movement of the substrate whenever the substrate is moved.

27. The method according to claim 20, comprising rotating the inlet, the outlet, or both, through an angle less than or equal to 360 degrees.

28. The method according to claim 20, comprising rotating the inlet, the outlet, or both, through an angle less than or equal to 200 degrees.

29. The method according to claim 20, comprising rotating the inlet, the outlet, or both only to positions where a direction from the inlet to the outlet is substantially parallel to and in the same direction as a scanning movement of the substrate.

30. The method according to claim 20, wherein a direction of the flow of the liquid in the space is substantially perpendicular to a direction of movement of the substrate.

31. The method according to claim 20, comprising rotating the inlet only about an axis substantially perpendicular to an exposure plane of the substrate.

32. The method according to claim 20, comprising rotating the outlet only about an axis substantially perpendicular to an exposure plane of the substrate.

33. The method according to claim 20, comprising rotating the inlet and outlet about an axis substantially perpendicular to an exposure plane of the substrate.

* * * * *